(12) United States Patent
Filippi et al.

(10) Patent No.: US 10,393,778 B2
(45) Date of Patent: Aug. 27, 2019

(54) DISAGGREGATION APPARATUS

(75) Inventors: Alessio Filippi, Eindhoven (NL); Tim Cornell Wilhelmus Schenk, Eindhoven (NL); Armand Michel Marie Lelkens, Heerlen (NL)

(73) Assignee: SIGNIFY HOLDING B.V., Eindhoven (NL)

(*) Notice: Subject to any disclaimer, the term of this patent is extended or adjusted under 35 U.S.C. 154(b) by 1033 days.

(21) Appl. No.: 13/879,896

(22) PCT Filed: Oct. 6, 2011

(86) PCT No.: PCT/IB2011/054399
§ 371 (c)(1),
(2), (4) Date: Apr. 17, 2013

(87) PCT Pub. No.: WO2012/052868
PCT Pub. Date: Apr. 26, 2012

(65) Prior Publication Data
US 2013/0289907 A1  Oct. 31, 2013

(30) Foreign Application Priority Data
Oct. 20, 2010 (EP) .................................. 10188236

(51) Int. Cl.
*G01R 21/00* (2006.01)
*G01R 21/133* (2006.01)
*G01D 4/00* (2006.01)
*G01R 19/25* (2006.01)

(52) U.S. Cl.
CPC .......... *G01R 21/133* (2013.01); *G01D 4/002* (2013.01); *G01R 19/2513* (2013.01);
(Continued)

(58) Field of Classification Search
CPC .. G01R 21/133; G01R 19/2513; G01D 4/002; Y02B 90/241; Y04S 20/32
(Continued)

(56) References Cited

U.S. PATENT DOCUMENTS 5,483,153 A  1/1996 Leeb
5,717,325 A  2/1998 Leeb
(Continued)

FOREIGN PATENT DOCUMENTS

JP  2003333768 A  11/2003
WO  199725625 A1  7/1997
(Continued)

OTHER PUBLICATIONS

H. Y. Lam, G. S. K. Fung; "A Novel Method to Construct Taxonomy of Electrical Appliances Based on Load Signatures;" 2007; IEEE Transactions on Consumer Electronics; vol. 53 No. 2; pp. 653-660.*
(Continued)

*Primary Examiner* — Mohamed Charioui
*Assistant Examiner* — Christine Y Liao

(57) ABSTRACT

The invention relates to a disaggregation apparatus (1) for identifying an electrical consumer in an electrical network (2). An electrical signature providing unit (7) provides electrical signatures of the electrical consumers (4, 5, 6), and an electrical parameter determining unit (8) determines an overall electrical parameter of the electrical network (2). An identification unit (9) identifies an electrical consumer depending on the determined overall electrical parameter and a correlation of the electrical signatures. Since the identification unit identifies an electrical consumer depending on the determined overall electrical parameter and a correlation of the electrical signatures, the identification of an electrical consumer does not depend on the detection of an event only. This makes the identification more robust, especially less prone to errors caused by missed events, thereby improving the reliability of identifying an electrical consumer in the electrical network.

11 Claims, 6 Drawing Sheets

(52) U.S. Cl.
CPC ............ *Y02B 90/241* (2013.01); *Y04S 20/222* (2013.01); *Y04S 20/242* (2013.01); *Y04S 20/32* (2013.01); *Y04S 20/38* (2013.01); *Y04S 20/40* (2013.01); *Y04S 20/42* (2013.01)

(58) Field of Classification Search
USPC .......................................................... 702/61
See application file for complete search history.

(56) References Cited

U.S. PATENT DOCUMENTS

| | | |
|---|---|---|
| 2008/0208496 A1 | 8/2008 | Habath |
| 2011/0112780 A1* | 5/2011 | Moss ...................... G01D 4/002 702/62 |
| 2011/0191041 A1 | 8/2011 | Diop |

FOREIGN PATENT DOCUMENTS

| | | |
|---|---|---|
| WO | 2004082200 A1 | 9/2004 |
| WO | 2010037988 A1 | 4/2010 |
| WO | 2010085816 A1 | 7/2010 |

OTHER PUBLICATIONS

F. Sultanem, "Using Appliance Signatures for Monitoring Residential Loads at Meter Panel Level," Oct. 1991, IEEE Transactions on Power Delivery, vol. 6, No. 4, pp. 1380-1385.*

Hart, George W. "Nonintrusive Appliance Load Monitoring" Proceedings of the IEEE, vol. 80, No. 12, pp. 1870-1891, Dec. 1992.

Verdu, S. "Multiuser Detection" Cambridge University Press, 1998, Chapter 2, pp. 16-26.

Lee, Kwangduk Douglas "Electric Load Information System based on Non-Instrusive Power Monitoring" Massachusetts Institute of Technology 2003.

Lee, Kwangduk Douglas, Estimation of Variable-Speed-Drive Power Consumption from Harmonic Content IEEE Transactions on Energy Conversion, vol. 20, No. 3, Sep. 2005.

Leeb, Steven Bruce "A Conjoint Pattern Recognition Approach to Nonintrusive Load Monitoring", Massachusetts Institute of Technology 1993.

Du, Yi et al "A Review of Identification and Monitoring Methods for Electric Loads in Commerical and Residential Building", IEEE 2010.

* cited by examiner

|         | Fig. 2 | Fig. 3 | Fig. 4 | Fig. 5 | Fig. 6 | Fig. 7 | Fig. 8 | Fig. 9 | Fig. 10 | Fig. 11 | Fig. 12 |
|---------|--------|--------|--------|--------|--------|--------|--------|--------|---------|---------|---------|
| Fig. 2  | 1.000  | 0.591  | 0.812  | 0.650  | 0.588  | 0.311  | 0.416  | 0.580  | 0.386   | 0.204   | 0.584   |
| Fig. 3  | 0.591  | 1.000  | 0.642  | 0.951  | 1.000  | 0.524  | 0.499  | 0.999  | 0.543   | 0.750   | 1.000   |
| Fig. 4  | 0.812  | 0.642  | 1.000  | 0.707  | 0.639  | 0.328  | 0.370  | 0.630  | 0.338   | 0.220   | 0.635   |
| Fig. 5  | 0.650  | 0.951  | 0.707  | 1.000  | 0.949  | 0.572  | 0.500  | 0.943  | 0.558   | 0.653   | 0.951   |
| Fig. 6  | 0.588  | 1.000  | 0.639  | 0.949  | 1.000  | 0.524  | 0.499  | 1.000  | 0.543   | 0.754   | 1.000   |
| Fig. 7  | 0.311  | 0.524  | 0.328  | 0.572  | 0.524  | 1.000  | 0.497  | 0.523  | 0.803   | 0.454   | 0.526   |
| Fig. 8  | 0.416  | 0.499  | 0.370  | 0.500  | 0.499  | 0.497  | 1.000  | 0.498  | 0.781   | 0.333   | 0.497   |
| Fig. 9  | 0.580  | 0.999  | 0.630  | 0.943  | 1.000  | 0.523  | 0.498  | 1.000  | 0.543   | 0.764   | 0.999   |
| Fig. 10 | 0.386  | 0.543  | 0.338  | 0.558  | 0.543  | 0.803  | 0.781  | 0.543  | 1.000   | 0.413   | 0.543   |
| Fig. 11 | 0.204  | 0.750  | 0.220  | 0.653  | 0.754  | 0.454  | 0.333  | 0.764  | 0.413   | 1.000   | 0.757   |
| Fig. 12 | 0.584  | 1.000  | 0.635  | 0.951  | 1.000  | 0.526  | 0.497  | 0.999  | 0.543   | 0.757   | 1.000   |

FIG. 13

101 - Obtain electrical signatures from electrical signature providing unit, by training the disaggregation apparatus, which includes switching on each individual electrical consumer one at the time and storing the corresponding electrical signature in the form of the current $i_n(t)$, which is synchronized with respect to the voltage waveform. The current signature $i_n(t)$ represents a single period.

102 – Determine overall electrical parameter of the electrical network, wherein the overall electrical current of the electrical network is measured.

103 – Identify one or more electrical consumers depending on the determined overall electrical parameter and a correlation of the electrical signatures. The one or more electrical consumer are identified by applying a multi user detection MUD method to the determined overall electrical parameter, wherein the signature correlation matrix is considered by using:
a model of the overall electrical parameter vector $\mathbf{i}_k$ as depending on a product of the unity signature correlation matrix, the amplitude matrix and an activity vector being indicative of the activity state of the respective electrical consumer or
a modified overall electrical parameter vector $\tilde{\mathbf{i}}_k$ depending on a difference between the overall electrical parameter vector and a product of the unity signature correlation matrix, an amplitude matrix and a unit vector,
with the MUD method.

FIG. 14

DISAGGREGATION APPARATUS

FIELD OF THE INVENTION

The invention relates to a disaggregation apparatus, a disaggregation method and a disaggregation computer program for identifying an electrical consumer in an electrical network

BACKGROUND OF THE INVENTION

The article "Nonintrusive Appliance Load Monitoring" by George W. Hart, Proceedings of the IEEE, vol. 80, no 12, pages 1870 to 1891, December 1992 discloses an apparatus for nonintrusive appliance load monitoring in an electrical network. The apparatus determines the consumed overall complex power of the electrical network and monitors changes in this complex power. A change in the complex power can be regarded as an event, wherein the apparatus is adapted to compare each event with stored power characteristics of electrical consumers of the electrical network, in order to determine which electrical consumer has caused the actual event. This allows, for example, determining which electrical consumer has been switched on or switched off depending on the consumed complex overall power of the electrical network. However, this apparatus has the disadvantage that it is prone to errors caused by missed events, thereby reducing the reliability of identifying an electrical consumer in the electrical network.

SUMMARY OF THE INVENTION

It is an object of the present invention to provide a disaggregation apparatus, a disaggregation method and a disaggregation computer program for identifying an electrical consumer in an electrical network, wherein the reliability of identifying an electrical consumer in the electrical network can be improved.

In a first aspect of the present invention a disaggregation apparatus for identifying an electrical consumer in an electrical network is presented, wherein the electrical network comprises a power source and multiple electrical consumers, wherein the disaggregation apparatus comprises:

an electrical signature providing unit for providing electrical signatures of the electrical consumers, an electrical parameter determining unit for determining an overall electrical parameter of the electrical network, an identification unit for identifying an electrical consumer depending on the determined overall electrical parameter and a correlation of the electrical signatures.

Since the identification unit identifies an electrical consumer depending on the determined overall electrical parameter and a correlation of the electrical signatures, the identification of an electrical consumer does not depend on the detection of an event only. This makes the identification more robust, especially less prone to errors caused by missed events, thereby improving the reliability of identifying an electrical consumer in the electrical network.

The electrical consumers are preferentially household appliances like a lamp, a hair dryer, a DVD player, a water cooker, a television, et cetera, or office appliances like PCs, screens, printers, lighting equipment, et cetera. The electrical consumers are preferentially connected in parallel in the electrical network.

The electrical signature providing unit is preferentially a storage unit, in which the electrical signatures of the electrical consumers are stored.

The electrical parameter determining unit comprises preferentially a current meter and/or a voltage meter for measuring the overall current of the electrical network and/or the overall voltage of the electrical network, respectively, as the overall electrical parameter. The electrical parameter determining unit can also be adapted to determine another overall electrical parameter like the consumed overall power, in particular, the consumed overall complex power, as the overall electrical parameter of the electrical network. The electrical parameter determining unit is preferentially adapted to determine the overall electrical parameter at a single central location, in particular, at the central electricity entrance location like at a meter cupboard.

The identification unit is preferentially adapted to identify one or several electrical consumers in the electrical network. In particular, if several electrical consumers are active, i.e., for example, are switched on, the identification unit can determine which electrical consumers are active depending on the determined overall electrical parameter and the correlation of the electrical signatures.

It is preferred that the electrical signatures are signature currents. Preferentially, the electrical signatures are current waveforms. In particular, the electrical signatures represent one period of a periodic current waveform. If the overall electrical parameter is the power or another electrical parameter, the electrical signatures can also represent a power waveform or a waveform of another electrical parameter.

It is further preferred that the identification unit is adapted to identify an electrical consumer by applying a multi user detection (MUD) method to the determined overall electrical parameter. The identification unit can be adapted to identify an electrical consumer by applying a Zero Force (ZF) MUD method to the determined overall electrical parameter, or the identification unit can be adapted to identify an electrical consumer by applying a Minimum Mean Square Error (MMSE) MUD method to the determined overall electrical parameter. MUD methods are known in the field of communication theory, for example, from the book "Multiuser Detection" by S. Verdu, Cambridge University Press, 1998. Applying a MUD method to the determined overall electrical parameter and, in particular, to the electrical signatures for identifying an electrical consumer in an electrical network further improves the reliability of this identification procedure.

It is further preferred that the identification unit is adapted to determine an overall electrical parameter vector by correlating the overall electrical parameter with each electrical signature, model the overall electrical parameter vector as depending on a product of a signature correlation matrix, which comprises correlations between the electrical signatures, and an activity vector being indicative of the activity state of the respective electrical consumer, determine the activity vector such that a similarity measure, which is indicative of the degree of similarity between the modeled overall electrical parameter vector and the determined overall electrical parameter vector, is maximized, identify an electrical consumer for which the determined activity vector indicates an active state. These steps allow identifying the electrical consumer in the electrical network with a further improved reliability.

It is preferred that the identification unit is adapted to model the overall electrical parameter vector as depending on a sum of i) the product of the signature correlation matrix and the activity vector, and ii) a noise vector. Considering the noise further improves the reliability of identifying an electrical consumer in the electrical network.

It is further preferred that the identification unit is adapted to determine an overall electrical parameter vector by correlating the overall electrical parameter with each electrical signature, determine a modified overall electrical parameter vector depending on a difference between the overall electrical parameter vector and a product of a signature correlation matrix, which comprises correlations between the electrical signatures, and a unit vector, model the modified overall electrical parameter vector as depending on a product of the signature correlation matrix and a modified activity vector, which depends on a difference between an activity vector, which is indicative of the activity state of the respective electrical consumer, and a constant, determine the modified activity vector such that a similarity measure, which is indicative of the degree of similarity between the modeled modified overall electrical parameter vector and the determined modified overall electrical parameter vector, is maximized, identify an electrical consumer for which the determined modified activity vector indicates an active state. It is preferred that the identification unit is adapted to determine an activity vector, which is indicative of the activity state of the respective electrical consumer, depending on the sign of a term comprising a product of an inverse unity signature correlation matrix, which comprises correlations between normalized electrical signatures, and a modified overall electrical parameter vector, wherein the modified overall electrical parameter vector is determined depending on a difference between an overall electrical parameter vector and a product of a) the unity signature correlation matrix, which comprises correlations between the normalized electrical signatures, b) an amplitude matrix, which comprises amplitudes of a part of the overall electrical parameter caused by the respective electrical consumer, and c) a unit vector, wherein the overall electrical parameter vector is determined by correlating the overall electrical parameter with each normalized electrical signature. Also these steps allow identifying an electrical consumer in the electrical network with an improved reliability.

In an embodiment, the identification unit is adapted to model the modified overall electrical parameter vector as depending on a sum of i) the product of the unity signature correlation matrix, the amplitude matrix and the activity vector, and ii) a noise vector.

In another aspect of the present invention a disaggregation method for identifying an electrical consumer in an electrical network is presented, wherein the electrical network comprises a power source and multiple electrical consumers, wherein the disaggregation method comprises:

providing electrical signatures of the electrical consumers, determining an overall electrical parameter of the electrical network, identifying an electrical consumer depending on the determined overall electrical parameter and a correlation of the electrical signatures.

In a further aspect of the present invention a disaggregation computer program for identifying an electrical consumer in an electrical network is presented, wherein the electrical network comprises a power source and multiple electrical consumers, the disaggregation computer program comprising program code means for causing a disaggregation apparatus as defined in claim 1 to carry out the steps of the disaggregation method as defined in claim 11, when the computer program is run on a computer controlling the disaggregation apparatus.

It shall be understood that the disaggregation apparatus of claim 1, the disaggregation method of claim 11 and a disaggregation computer program of claim 12 have similar and/or identical preferred embodiments as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

BRIEF DESCRIPTION OF THE DRAWINGS

In the following drawings:

FIG. 13 shows schematically and exemplarily a signature correlation matrix, and FIG. 14 shows a flowchart exemplarily illustrating an embodiment of a disaggregation method for identifying an electrical consumer in an electrical network.

DETAILED DESCRIPTION OF EMBODIMENTS

Figure 1:
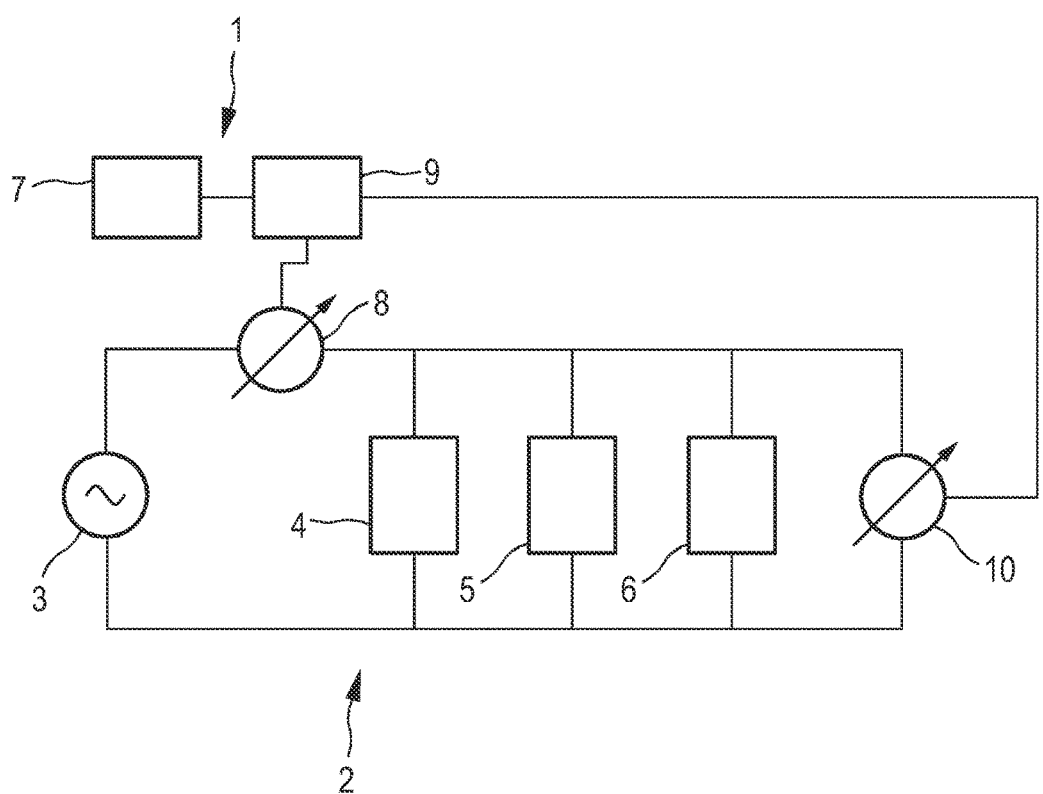
FIG. 1 shows schematically and exemplarily an embodiment of a disaggregation apparatus for identifying an electrical consumer in an electrical network.

FIG. 1 shows schematically and exemplarily an embodiment of a disaggregation apparatus for identifying an electrical consumer in an electrical network. The electrical network 2 comprises a power source 3 and multiple electrical consumers 4, 5, 6. The disaggregation apparatus 1 comprises an electrical signature providing unit 7 for providing electrical signatures of the electrical consumers 4, 5, 6, an electrical parameter determining unit 8 for determining an overall electrical parameter of the electrical network 2, and an identification unit 9 for identifying an electrical consumer depending on the determined overall electrical parameter and depending on a correlation of the electrical signatures.

The electrical consumers 4, 5, 6 are preferentially household or office appliances like a lamp, a hair dryer, a DVD player, a water cooker, a television, computers, printers, air conditioning system et cetera. The electrical consumers 4, 5, 6 are connected in parallel in the electrical network 2.

The electrical signature providing unit 7 is a storage unit in which the electrical signatures of the electrical consumers 4, 5, 6 are stored. In this embodiment, the electrical signatures are signature currents. In particular, the electrical signatures are current waveforms, wherein an electrical signature represents one period of a periodic current waveform. Electrical signatures of a selection of electrical consumers are exemplarily shown in FIGS. 2 to 12 in arbitrary units depending on time in arbitrary units.

Figure 2:
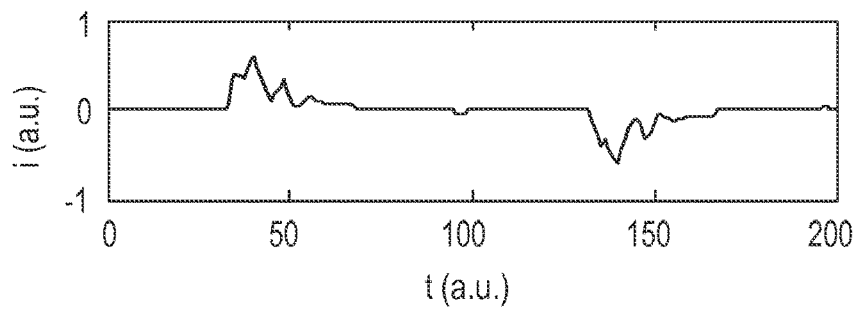
FIGS. 2 to 12 show electrical signatures of several electrical consumers.
Figure 3:
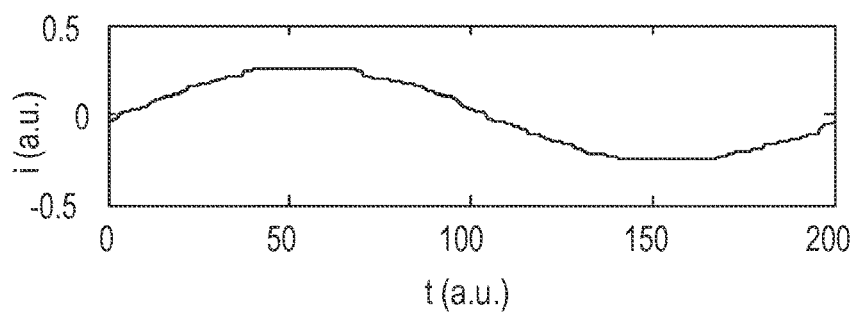
Figure 4:
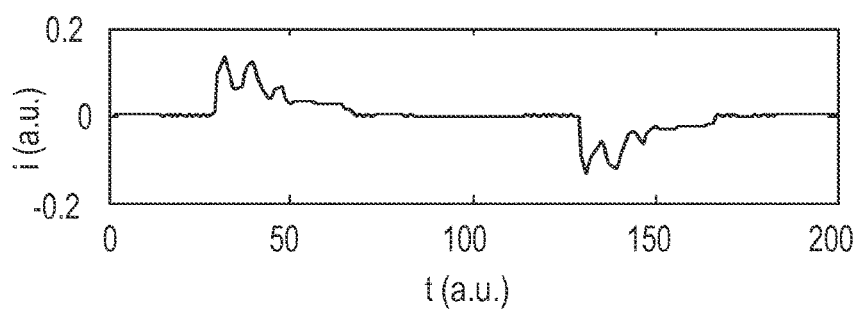
Figure 5:
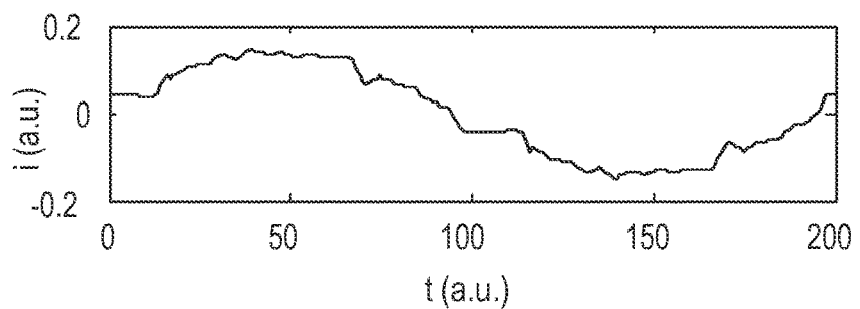
Figure 6:
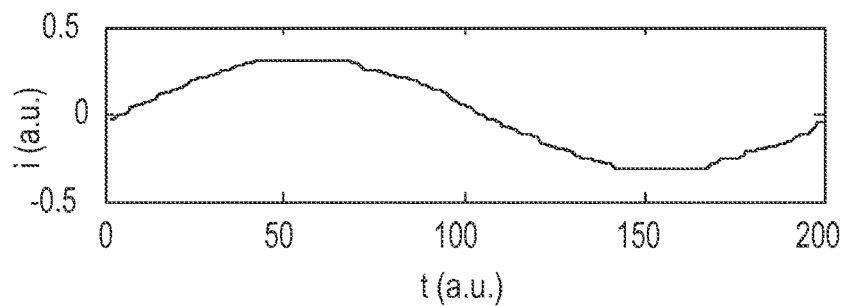
Figure 7:
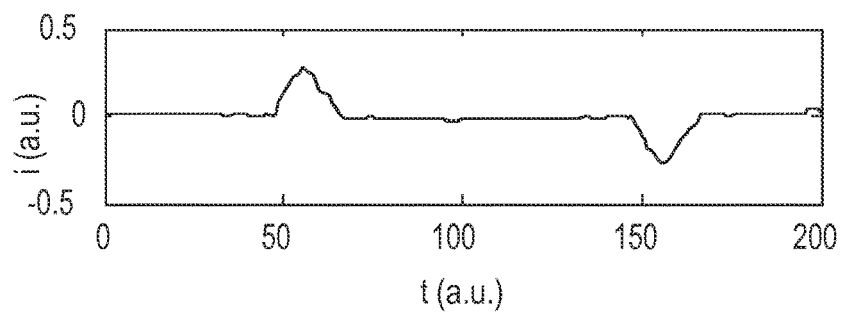
Figure 8:
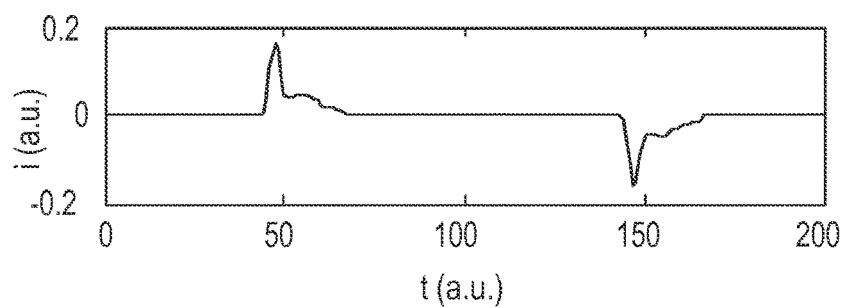
Figure 9:
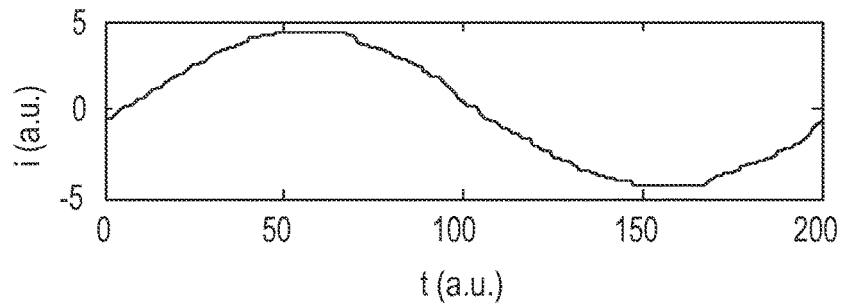
Figure 10:
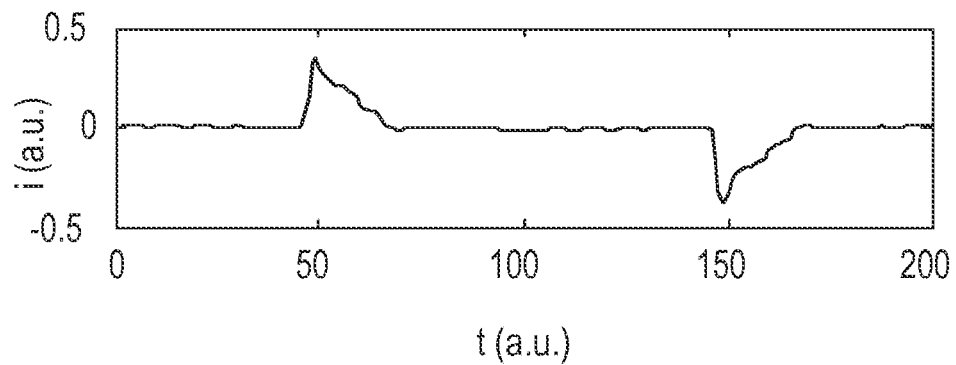
Figure 11:
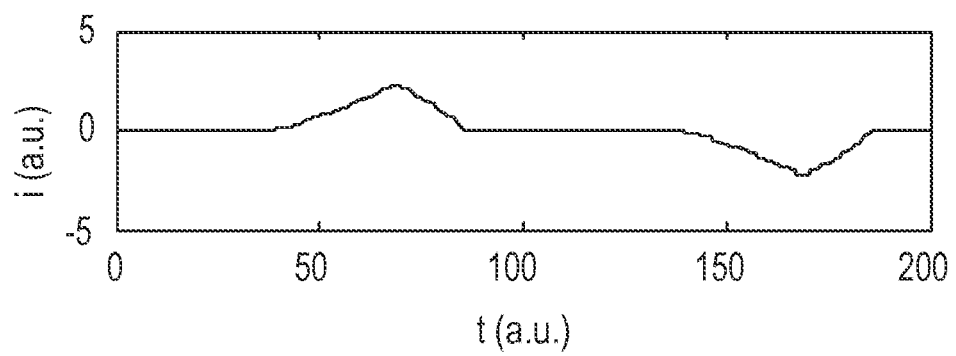
Figure 12:
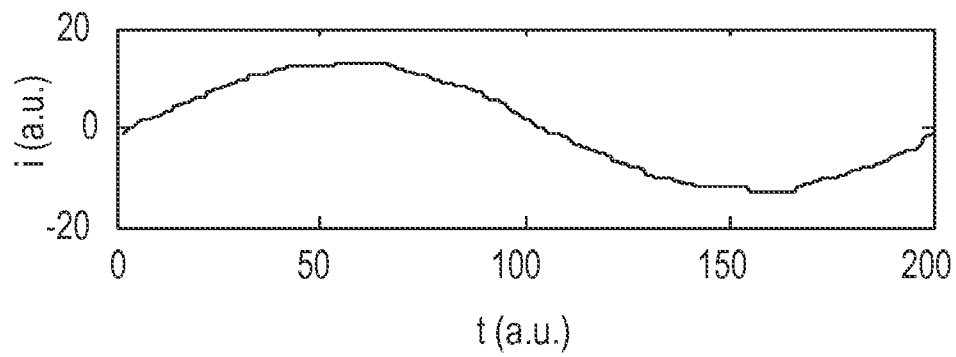

FIG. 2 shows an electrical signature of a compact fluorescent lamp (CFL) with a nominal power of 20 W. FIG. 3 shows an electrical signature of an incandescent light having a nominal power of 40 W. FIG. 4 shows an electrical signature of a CFL with a nominal power of 5 W. FIG. 5 shows an electrical signature of an halogen lamp having a nominal power of 20 W. FIG. 6 shows an electrical signature of a halogen lamp with a nominal power of 50 W. FIG. 7 shows an electrical signature of Living Colors of the company Philips having a nominal power of 14.5 W. FIG. 8 shows an electrical signature of a light emitting diode having a nominal power of 4 W. FIG. 9 shows an electrical signature of a hair dryer having an nominal power of 700 W. FIG. 10 shows an electrical signature of a DVD player having a nominal power of 14 W. FIG. 11 shows an electrical signature of a television with ambilight having a nominal power of 145 W and FIG. 12 shows an electrical signature of a water cooker having an nominal power of 2200 W.

The electrical signatures have different shapes and different current amplitudes.

The electrical parameter determining unit 8 is preferentially a current meter for measuring the overall current of the electrical network 2. The electrical parameter determining unit 8 measures the overall current at a single central location, in particular, at the central electricity entrance location like at a meter cupboard. The disaggregation apparatus further comprises a voltmeter 10 for measuring the voltage of the electrical network 2.

The identification unit 9 is adapted to identify an electrical consumer by applying a MUD method to the determined overall electrical parameter being, in this embodiment, the measured overall current. MUD methods are used in communication theory. In order to adapt the MUD methods used in communication theory to the energy disaggregation problem, the electrical devices are regarded as "users" and the electrical network 2 connecting all the electrical consumers 4, 5, 6 is regarded as the "communication channel". Moreover, the current signature of each electrical consumer 4, 5, 6 during one voltage period can be regarded as the "code" of the respective electrical consumer. The application of a MUD method to the measured overall current is inherently more robust than an event driven approach, because it exploits more properties of the electrical signatures. At the same time it enables to derive a unique combination of active electrical consumers.

In order to apply a MUD method to energy disaggregation a mathematical model is introduced, which considers similarities and differences between the two fields.

The electrical network described above with reference to FIG. 1 represents preferentially a single phase house wiring, wherein all appliances, i.e. all electrical consumers, are simply connected in parallel. The overall current $i_{tot,k}(t)$ is then the sum of the currents flowing through the N electrical consumers connected in parallel. The number N of electrical consumers is, for example, three. The current going through a respective electrical consumer, which is indicated by the index n, is represented by $A_n i_n(t)$. In this notation $A_n$ indicates the peak value and $i_n(t)$ the normalized current waveform with peak current equal to one of the respective electrical consumer indicated by the index n.

The current $A_n i_n(t)$ going through an electrical consumer indicated by the index n during a voltage period T can be regarded as being the electrical signature of the respective electrical consumer. During one period of the periodic waveform, the overall current can be written as $$i_{tot,k}(t) = \sum_{n=1}^{N} A_n b_{k,n} i_n(t) + \sigma \eta(t), \quad 0 \leq t < T. \quad (1)$$

In equation (1), the term $\sigma \eta(t)$ indicates an additive noise which may corrupt the overall current with power $\sigma^2$. In the proposed notation, $\eta(t)$ has unit power and represents the possible additive disturbances in the observed signal. Moreover, in equation (1) $b_{k,n}$ can have the value one or the value zero, in order to indicate whether the electrical consumer with the index n is active (value one) or inactive (value zero) at the time instance k. Preferentially, the respective electrical consumer is active, if it is switched on, and the respective electrical consumer is inactive, if it is switched off. The adaptive noise can be modelled as adaptive white Gaussian noise (AWGN). However, in other embodiments, the adaptive noise can also be modelled in another way. Under the AWGN assumption, the most likely combination of active electrical consumers can be the combination that maximizes following function:

$$\hat{b}_{k,n} = \underset{b_{k,n}}{\operatorname{argmax}} \exp\left\{-\frac{1}{2\sigma^2} \int_0^T \left(i_{tot,k}(t) - \sum_{n=1}^{N} A_n b_{k,n} i_n(t)\right)^2 dt\right\}. \quad (2)$$

Considering equation (2), an optimum solution would involve looking for all possible combinations of $\hat{b}_{n,k}$ and choosing the one for which $$\sum_{n=1}^{N} A_n \hat{b}_{k,n} i_n(t)$$

is closest to the observed overall current. However, the adaptation of the MUD method used in the field of communication theory to the disaggregation problem can be further simplified by assuming that the receiver used in the field of communication theory is made of a bank of matched filters. The outputs of the matched filters provide sufficient statistics, i.e. the optimum solution in the Maximum Likelihood sense can be derived based upon the output of the matched filters. Thus, the identification unit 9 is preferentially adapted to determine an overall electrical parameter vector $i_k$ by correlating the overall electrical current $i_{tot,k}$ with each electrical signature $i_n$ in accordance with following two equations:

$$i_{n,k} = \int_0^T i_{tot,k}(t) i_n(t) dt, \quad (3)$$

and $$i_k = [\, i_{1,k} \quad i_{2,k} \quad \ldots \quad i_{N,k} \,]. \quad (4)$$

The identification unit 9 is further adapted to determine a unity signature correlation matrix $R = R_{nm}$, which comprises correlations between the electrical signatures as defined by following equation:

$$R_{nm} = \int_0^T i_n(t) i_m(t) dt. \quad (5)$$

The matrix defined in equation (5) is named unity signature correlation matrix, because it describes a correlation between normalized current waveforms with peak current equal to one of the respective electrical consumer indicated by the index m.

The identification unit 9 is further adapted to determine an amplitude matrix A, which comprises the amplitudes $A_n$ of the electrical signatures, i.e. of the respective parts of the overall electrical current caused by the respective active electrical consumers, as defined by following equation:

$$A = \begin{bmatrix} A_1 & 0 & \cdots & 0 \\ 0 & A_2 & & \\ \vdots & & \ddots & 0 \\ 0 & & 0 & A_N \end{bmatrix}. \quad (6)$$

The unity signature correlation matrix R and the amplitude matrix A form a signature correlation matrix, which can be determined in advance, for example, before the actual overall current is measured, because the peak value $A_n$ and the normalized current waveform $i_n(t)$ are indicative of the respective electrical consumer and are known from, for instance, initial measurements of the electrical signatures of the electrical consumers. The current waveforms are preferentially taken over one voltage period and are preferably synchronized with respect to the voltage period. In another embodiment, the current waveforms can also be taken over more than one voltage period, wherein also in this case the current waveforms are synchronized with respect to the voltage periods. The current waveforms can be synchronized by registering each current waveform with respect to a voltage period starting from a positive zero crossing, i.e. from negative to positive, of the voltage period. Thus, the identification unit 9 can comprise a storage unit, in which the unity signature correlation matrix R and the amplitude matrix A are stored already and from which the unity signature correlation matrix and the amplitude matrix can be retrieved for identifying one or several electrical consumers, which are active, in particular, which are switched on. Instead of storing a separate unity signature correlation matrix R and a separate amplitude matrix A also a signature correlation matrix comprising correlations of electrical signatures having the respective amplitude can be stored in the storage unit.

The identification unit 9 is further adapted to model the overall electrical parameter vector $i_k$ as depending on a product of the unity signature correlation matrix, the amplitude matrix and an activity vector $b_k$ being indicative of the activity state of the respective electrical consumer as defined by following equation:

$$i_k = RAb_k + \sigma\eta, \quad (7)$$

wherein the activity vector can be defined by following equation:

$$b_k = [b_{k,1} \ b_{k,2} \ \ldots \ b_{k,N}]^T. \quad (8)$$

In equation (7) the adaptive noise term $\sigma\eta_1$ comprises a noise vector $\eta$ defined by following equations:

$$\eta = [\eta_1 \ \eta_2 \ \cdots \ \eta_N]^T \text{ and} \quad (9)$$

$$\eta_n = \int_0^T \eta(t) i_n(t) \, dt. \quad (10)$$

The identification unit 9 is adapted to determine the activity vector $b_k$ such that a similarity measure, which is indicative of the degree of similarity between the modeled overall electrical parameter vector and the determined overall electrical parameter vector $i_k$, is maximized, and to identify one or several electrical consumers for which the determined activity vector $b_k$ indicates an active state. The similarity measure is, for example, the inverse Euclidean norm of the difference vector of the modeled overall electrical parameter vector and the determined overall electrical parameter vector. The identification unit 9 can be adapted to determine such an activity vector by applying a conventional MUD method to the compact matrix notation of the overall current as defined in equation (7). The resulting activity vector $b_k$ at the time instance k determines which electrical consumers are active and which electrical consumers are inactive at that particular time instance. Different MUD methods can be used for determining the activity vector. The choice of the respective MUD method can depend on the properties of the signature correlation matrix, the noise vector and the available computational power. For instance, if the correlation matrix is invertible and the noise power is low with respect to the useful signal power, i.e. the current signatures, the Zero Force (ZF) MUD detection method could be the preferred choice.

The identification unit 9 can therefore be adapted to, for example, identify an electrical consumer by applying a ZF MUD method or a Minimum Means Square Error (MMSE) MUD method to the determined overall electrical current. In the field of communication theory these MUD methods are known from, for example, the above mentioned book by S. Verdu. The ZF MUD method or the MMSE MUD method is preferentially used with the compact matrix notation of the overall current as defined in equation (7).

In particular, the identification unit 9 is preferentially adapted to modify the overall electrical parameter vector $i_k$ such that a modified overall electrical parameter vector $\tilde{i}_k$ is generated depending on a difference between the overall electrical parameter vector $i_k$ and a product of the unity signature correlation matrix R, an amplitude matrix A and a unit vector 1 in accordance with following equation:

$$\tilde{i}_k = 2i_k - RA\mathbf{1}, \quad (11)$$

wherein the unit vector 1 indicates a vector of proper size with elements all equal to one. If equation (7) is substituted in equation (11) following equation is obtained:

$$\tilde{i}_k = RA(2b_k - 1) + 2\sigma\eta = RA\tilde{b}_k + 2\sigma\eta. \quad (12)$$

In an embodiment, the identification unit 9 can therefore also be adapted to model the modified overall electrical parameter vector $\tilde{i}_k$ as depending on a product of the unity signature correlation matrix R, the amplitude matrix A, and a modified activity vector $\tilde{b}_k$, which depends on a difference between the activity vector $b_k$ and a constant preferentially in accordance with following equation:

$$\tilde{b}_k = (2b_k - 1). \quad (13)$$

As can be seen in equation (12), also in this embodiment an additional noise term is considered. The identification unit 9 can be adapted to determine the modified activity vector $\tilde{b}_k$ such that a similarity measure, which is indicative of the degree of similarity between the modeled modified overall electrical parameter vector and the determined modified overall electrical parameter vector, is maximized and to identify an electrical consumer for which the determined modified activity vector $\tilde{b}_k$ indicates an active state. Also in this embodiment the similarity measure is, for example, the inverse Euclidean norm of a difference vector between the modeled modified overall electrical parameter vector and the determined modified overall electrical parameter vector. The identification unit 9 can be adapted to determine a modified activity vector $\tilde{i}_k$, which maximizes the similarity measure, by applying a MUD method to equation (12). For example, the identification unit 9 can be adapted to apply the conventional ZF MUD method as presented in the above mentioned book by S. Verdu to equation (12), thereby determining the activity vector in accordance with following equation:

$$\hat{b}_k = \operatorname{sign}(R^{-1}\tilde{i}_k) = \operatorname{sign}(A\hat{b}_k + 2R^{-1}\sigma\eta). \qquad (14)$$

If the identification unit 9 is adapted to apply a MMSE MUD method to equation (12), the modified activity vector is preferentially determined in accordance with following equation:

$$\hat{b}_k = \operatorname{sign}[(R + \sigma^2 A^{-2})^{-1}\tilde{i}]. \qquad (15)$$

In accordance with equation (13), if the determined modified activity value $\hat{b}_{k,n}$ is +1, the respective value $b_{k,n}$ of the activity vector is one, and, if the value $\hat{b}_{k,n}$ is −1, the respective value $b_{k,n}$ of the activity vector is zero. Thus, a threshold can be defined being zero, wherein, if the respective value of the modified activity vector is larger than the threshold, the respective electrical consumer is active at the respective time instance and, if the respective value of the modified activity vector is smaller than the threshold, the respective electrical consumer is inactive at the respective time instance.

FIG. 13 illustrates exemplarily a unity signature correlation matrix R comprising correlations, which are based on the electrical signatures shown in FIGS. 2 to 12.

The identification unit 9 can further be adapted to determine the energy consumption of the electrical consumers, which have been identified as being active. The identification unit 9 determines at each time instance which electrical consumer is switched on and which electrical consumer is switched off. Moreover, the identification unit 9 can be adapted to determine at each time instance the power consumed by the respective electrical consumer by multiplying the amplitude $A_n$ of the respective electrical consumer with the measured voltage. The identification unit 9 can integrate the determined power of the respective electrical consumer over time, in order to determine the energy consumption of the respective electrical consumer. This can be performed for each electrical consumer, which is switched on, in order to determine for each active electrical consumer the consumed energy. For instance, if it has been determined that an electrical consumer consumes a power of 1 W and if it has been determined that the respective electrical consumer was switched on for one hour, the consumed energy can be determined as being 1 Wh. In the following an embodiment of a disaggregation method for identifying an electrical consumer in an electrical network will exemplarily be described with reference to a flowchart shown in FIG. 14.

In step 101, electrical signatures of the electrical consumers 4, 5, 6 are provided. The electrical signatures are provided by an electrical signature providing unit 7 in which the electrical signatures of the electrical consumers 4, 5, 6 are stored. Before storing, the electrical signatures can be determined by training the disaggregation apparatus, in particular, by using self-training solutions. A preferred training method consists of switching on each individual electrical consumer one at the time and storing the corresponding electrical signature in the form of the current $i_n(t)$ which should be further synchronized with respect to the voltage waveform. The current signature $i_n(t)$ represents a single period that could be improved by averaging over multiple periods. Other training methods can be used for determining the electrical signatures, which are then stored in the electrical signature providing unit 7.

In step 102, an overall electrical parameter of the electrical network 2 is determined. In particular, an overall electrical current of the electrical network 2 is measured. In step 103, an electrical consumer is identified depending on the determined overall electrical parameter and a correlation of the electrical signatures. In particular, one or several electrical consumers, which are active, are identified by applying a MUD method to the determined overall electrical parameter, wherein the signature correlation matrix is considered by using, for example, equation (7) or equation (12) with the MUD method.

The energy ecosystem is undergoing significant changes due to three main drivers: the liberalization of the energy market at least in the EU, the increased costs of energy and the increased sensitivity of the public on the ecological footprint of the energy sources.

The latter two aspects are also behind the validated user need to better understand and control their energy consumption and their energy bill. Non Intrusive Load Monitoring (NILM) is the most promising technology to address this user need. NILM promises to provide the user with full details on how much energy each single electrical appliance consumes with the installation of a single sensor.

A main difference between known disaggregation apparatuses and disaggregation methods and the present disaggregation apparatus and disaggregation method is the fact that the correlation matrix is used. Basically, the disaggregation apparatus and the disaggregation method take into account the "crosstalk" between the active electrical consumers, rather than seeing it as interference.

In an embodiment, the identification unit 9 can be adapted to average the total current measured by the electrical parameter determining unit 8 over certain time intervals and to use the averaged total current, which corresponds to the time intervals, for identifying an electrical consumer as described above, i.e. in the above described equations instead of the actually measured current the average current, which corresponds to several time intervals over which the current has been averaged, can be used. This can reduce noise and, thus, improve the quality of identifying an electrical consumer in the electrical network.

Although in the above described embodiments to each electrical consumer only a single electrical signature is assigned, also several electrical signatures can be assigned to the same electrical consumer, wherein the several electrical signatures correspond to several on states of the respective electrical consumer. Thus, the identification unit can be adapted to identify an electrical consumer and to determine the actual on state of the identified electrical consumer. For example, an electrical consumer like a television may have a stand-by electrical signature and a completely switched on electrical signature, wherein the identification unit can be adapted to identify the electrical consumer and to determine whether the identified electrical consumer is in a stand-by mode or completely switched on mode depending on the correlation of all electrical signatures including the stand-by electrical signature and the completely switched on electrical signature.

Although in the above described embodiments, certain MUD methods have been applied to the overall electrical parameter, in particular, to the overall current, in order to identify one or several electrical consumers which are active, also other MUD methods, in particular, also other linear MUD methods, can be applied to the determined overall electrical parameter.

Although in the above described embodiments the electrical parameter determining unit is adapted to measure an overall current of the electrical network, in addition or alternatively the electrical parameter determining unit can also be adapted to measure a voltage of the electrical network. In particular, the electrical parameter determining unit can be adapted to determine the consumed overall power, for example, the consumed overall complex power based on the measured overall current and the measured voltage as the overall electrical parameter of the electrical network. Correspondingly, the electrical signatures of the electrical consumers can also be power waveforms.

Although in the embodiment described above with reference to FIG. 1 the electrical network comprises three electrical consumers, the electrical network can also comprise more or less than three electrical consumers, wherein the disaggregation apparatus is adapted to identify one or several of these electrical consumers, which are active, in particular, which are switched on.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Determinations like the determination of an overall electrical parameter, of an overall electrical parameter vector, of an activity vector, et cetera, or other method steps performed by one or several units or devices can be performed by any other number of units or devices. The determinations and calculations and/or the control of the disaggregation apparatus in accordance with the disaggregation method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a disaggregation apparatus for identifying an electrical consumer in an electrical network. An electrical signature providing unit provides electrical signatures of the electrical consumers, and an electrical parameter determining unit determines an overall electrical parameter of the electrical network. An identification unit identifies an electrical consumer depending on the determined overall electrical parameter and a correlation of the electrical signatures. Since the identification unit identifies an electrical consumer depending on the determined overall electrical parameter and a correlation of the electrical signatures, the identification of an electrical consumer does not depend on the detection of an event only. This makes the identification more robust, especially less prone to errors caused by missed events, thereby improving the reliability of identifying an electrical consumer in the electrical network.

The invention claimed is:

1. A disaggregation apparatus for identifying an electrical consumer in an electrical network, wherein the electrical network comprises a power source and multiple electrical consumers, the disaggregation apparatus comprising:
   an electrical signature providing unit for providing electrical signatures ($i_n$) of each of the electrical consumers, the electrical signature providing unit including a training method to switch on each electrical consumer one at the time and storing the corresponding electrical signature in the form of a current signature,
   an electrical parameter determining unit for determining an overall electrical parameter ($i_{tot,k}$) of the electrical network, wherein the overall electrical current of the electrical network is measured,
   an identification unit configured to normalize each of said electrical signatures ($i_n$), to generate a unity signature correlation matrix (R), which comprises correlations between each of said normalized electrical signatures with peak current equal to one of the respective electrical consumer's current, and identify an electrical consumer based at least partly upon the determined overall electrical parameter ($i_{tot,k}$) and the unity signature correlation matrix (R).

2. The disaggregation apparatus as defined in claim 1, wherein the identification unit is configured to identify an electrical consumer by applying a multi user detection (MUD) method to the determined overall electrical parameter ($i_{tot,k}$) wherein the electrical consumers are regarded as users and the electrical network is regarded as communication channel.

3. The disaggregation apparatus as defined in claim 2, wherein the identification unit is configured to identify an electrical consumer by applying a Zero Force (ZF) MUD method to the determined overall electrical parameter ($i_{tot,k}$).

4. The disaggregation apparatus as defined in claim 2, wherein the identification unit is configured to identify an electrical consumer by applying a Minimum Mean Square Error (MMSE) MUD method to the determined overall electrical parameter ($i_{tot,k}$).

5. The disaggregation apparatus as defined in claim 1, wherein the identification unit is configured to
   determine an overall electrical parameter vector ($i_k$) by correlating the overall electrical parameter ($i_{tot,k}$) with each electrical signature ($i_n$)
   model the overall electrical parameter vector ($i_k$) as depending on a product of a signature correlation matrix (RA), which comprises correlations between the electrical signatures, and an activity vector ($b_k$) being indicative of the activity state of the respective electrical consumer,
   determine the activity vector ($b_k$) such that a similarity measure, which is indicative of the degree of similarity between the modeled overall electrical parameter vector and the determined overall electrical parameter vector ($i_k$), is maximized,
   identify an electrical consumer for which the determined activity vector ($b_k$) indicates an active state.

6. The disaggregation apparatus as defined in claim 5, wherein the identification unit is configured to model the overall electrical parameter vector ($i_k$) as depending on a sum of i) the product of the signature correlation matrix (RA) and the activity vector ($b_k$), and ii) a noise vector ($\sigma\eta$).

7. The disaggregation apparatus as defined in claim 1, wherein the identification unit (9) is configured to
- determine an overall electrical parameter vector ($\tilde{i}_k$) by correlating the overall electrical parameter ($i_{tot,k}$) with each electrical signature ($i_n$),
- determine a modified overall electrical parameter vector ($\tilde{i}_k$) depending on a difference between the overall electrical parameter vector ($i_k$) and a product of a signature correlation matrix (RA), which comprises correlations between the electrical signatures, and a unit vector (1),
- model the modified overall electrical parameter vector ($\tilde{i}_k$) as depending on a product of the signature correlation matrix (RA) and a modified activity vector ($\tilde{b}_k$), which depends on a difference between an activity vector ($b_k$), which is indicative of the activity state of the respective electrical consumer, and a constant,
- determine the modified activity vector ($\tilde{b}_k$) such that a similarity measure, which is indicative of the degree of similarity between the modeled modified overall electrical parameter vector and the determined modified overall electrical parameter vector ($\tilde{i}_k$), is maximized,
- identify an electrical consumer for which the determined modified activity vector ($\tilde{b}_k$) indicates an active state.

8. The disaggregation apparatus as defined in claim 1, wherein the identification unit is configured to determine an activity vector ($b_k$), which is indicative of the activity state of the respective electrical consumer, depending on the sign of a term comprising a product of an inverse unity signature correlation matrix ($R^{-1}$), which comprises correlations between normalized electrical signatures ($i_n$), and a modified overall electrical parameter vector ($\tilde{i}_k$) wherein the modified overall electrical parameter vector ($\tilde{i}_k$) is determined depending on a difference between an overall electrical parameter vector ($i_k$) and a product of
   a) the unity signature correlation matrix (R),
   b) an amplitude matrix (A), which comprises amplitudes ($A_n$) of a part of the overall electrical parameter caused by the respective electrical consumer, and
   c) a unit vector (1), wherein the overall electrical parameter vector ($i_k$) is determined by correlating the overall electrical parameter ($i_{tot,k}$) with each normalized electrical signature ($i_n$).

9. The disaggregation apparatus as defined in claim 8, wherein the identification unit is configured to model the modified overall electrical parameter vector ($\tilde{i}_k$) as depending on a sum of i) the product of the unity signature correlation matrix (R), the amplitude matrix (A) and the activity vector ($b_k$), and ii) a noise vector ($\sigma\eta$).

10. A disaggregation computer program for identifying an electrical consumer in an electrical network, wherein the electrical network comprises a power source and multiple electrical consumers, the disaggregation computer program comprising program code means for causing a disaggregation apparatus as defined in claim 1 to carry out the steps of the disaggregation method, when the computer program is run on a computer controlling the disaggregation apparatus.

11. A disaggregation method for identifying an electrical consumer in an electrical network, wherein the electrical network comprises a power source and multiple electrical consumers, the disaggregation method comprising:
- providing electrical signatures of each of the electrical consumers, wherein the providing electrical signatures includes a training method that includes switching on each electrical consumer one at the time and storing the corresponding electrical signature in the form of the a current signature,
- normalizing each of said electrical signatures,
- generating a unity signature correlation matrix, which comprises correlations between each of said normalized electrical signatures with peak current equal to one of the respective electrical consumer's current,
- determining an overall electrical parameter of the electrical network, by measuring the overall electrical current of the electrical network
- identifying an electrical consumer depending on the determined overall electrical parameter and the unity signature correlation matrix.

* * * * *